United States Patent
Takayama et al.

(10) Patent No.: US 6,902,424 B2
(45) Date of Patent: Jun. 7, 2005

(54) SOCKET FOR ELECTRICAL PARTS

(75) Inventors: Naoaki Takayama, Kawaguchi (JP); Hiroshi Miyazaki, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/404,635

(22) Filed: Apr. 1, 2003

(65) Prior Publication Data

US 2004/0018762 A1 Jan. 29, 2004

(30) Foreign Application Priority Data

Apr. 2, 2002 (JP) .................................. 2002-099849
Apr. 16, 2002 (JP) .................................. 2002-113899

(51) Int. Cl.⁷ .............................................. H01K 7/20
(52) U.S. Cl. ............................................... 439/487
(58) Field of Search ............................ 439/264, 485, 439/487; 361/704

(56) References Cited

U.S. PATENT DOCUMENTS

| 4,679,118 | A | * | 7/1987 | Johnson et al. | ............. | 439/487 |
| 6,383,002 | B1 | * | 5/2002 | Ohashi | ....................... | 439/487 |
| 6,490,161 | B1 | * | 12/2002 | Johnson | ...................... | 439/485 |
| 2003/0051868 | A1 | * | 3/2003 | Dishongh et al. | ........... | 361/704 |

* cited by examiner

*Primary Examiner*—Renee Luebke
(74) *Attorney, Agent, or Firm*—Lawrence E. Laubscher, Jr.

(57) ABSTRACT

A socket for electrical parts, which detachably holds an electrical part such as an IC package on a mounting portion thereof and connects the electrical part electrically to external circuit, capable of improving the heat dissipation capability of a heat sink which dissipates the heat generated from the electrical part, in a state of being in contact with the electrical part mounted on the mounting portion, and also capable of preventing damage to the electrical part.

9 Claims, 10 Drawing Sheets

(a)

(b)

(a)

(b)

SOCKET FOR ELECTRICAL PARTS

BACKGROUND OF THE INVENTION

1. Field of the Invention

The present invention relates to a socket for electrical parts, which detachably holds an electrical part such as an IC package on a mounting portion thereof and connects the electrical part electrically to an external circuit, and more particularly, relates to a socket for electrical parts, capable of improving the heat dissipation capability of a heat sink which dissipates the heat generated from the electrical part, when in contact with the electrical part mounted on the mounting portion, and also capable of preventing damage to the electrical part.

2. Description of the Related Art

Conventionally, in the testing of the performance of electrical parts such as a BGA type IC package for example, a socket is used for electrical parts, which detachably holds an electrical part on a mounting portion thereof and electrically connects the electrical part to an external measuring apparatus such as a circuit. A conventional socket for electrical parts of this type includes a socket body on which is formed a mounting portion for mounting an electrical part such as an IC package; a plurality of contact pins disposed on the socket body and capable of connecting with respective connection terminals provided on a lower surface of the IC package which is mounted on the mounting portion; and heat sinks attached to a pair of left and right opening/closing members that can be opened/closed by operation of operating members provided on the socket body, for dissipating the heat generated from heat generating locations of the IC package in a state where the opening/closing members are closed and the heat sinks are in contact with the IC package.

In addition, such a socket for electrical parts is designed so that when downward pressure is applied to the operating members, the heat sinks attached to the pair of left and right opening/closing members are opened out towards the left and right. Furthermore, when the downward pressure is released, the heat sinks having been opened to the left and right are closed, to cover the mounting portion of the socket body. Consequently, in order to hold the IC package in the socket, first the heat sinks are opened and the IC package is mounted on an upper surface of the mounting portion, and then the opened heat sinks are closed. At this point, the heat sinks are in contact, at a predetermined pressure, with the IC package mounted on the mounting portion, thereby securing the IC package.

Performance testing of the IC package held in the socket is carried out by electrically connecting the respective connection terminals of the IC package to an external testing apparatus via the plurality of contact pins. While the performance testing is being carried out, the heat generated from the heat generating locations of the IC package is conducted through contact surfaces of the heat sinks being in contact with the IC package, and then transmitted and dissipated into the open air (into the atmosphere) from cooling fins formed on the heat sinks.

However, in such a conventional socket for electrical parts, the heat sinks are formed entirely from a lightweight material such as aluminum, in order to minimize a load applied to the IC package when the heat sinks are closed and pressure is applied to the IC package. Consequently, sometimes the heat generated from the IC package during the performance testing of the IC package is not conducted sufficiently to the contact surfaces of the heat sinks, and the heat cannot be dissipated effectively from the cooling fins into the open air. Accordingly, there is a possibility that heat is accumulated inside the IC package and the socket for electrical parts, causing damage to the IC package.

Furthermore, in the conventional socket for electrical parts, there is a predetermined limit to the size of the contact surfaces of the heat sinks that dissipate the heat generated from the IC package into the open air. For example, as shown in FIG. 15, in the case where contact surfaces 51 of left and right heat sinks 50 are formed so as to project further outward than outside edges of an IC package 40 when the left and right heat sinks 50 are closed, there is a possibility that edge portions (see (a) in FIG. 15) of the IC package 40 are damaged by the contact surfaces 51 of the heat sinks 50. Or, sometimes inside bottom edges (see (b) in FIG. 15) of the contact surfaces 51 of the left and right heat sinks 50 are in contact with each other, causing the heat sinks 50 to be broken or deformed. Therefore, as shown in FIG. 16, it is necessary for the heat sinks 50 to be formed such that the contact surfaces 51 thereof do not project further than the outside edges of the IC package 40. In such a case, sometimes the entire area of the contact surfaces 51 of the left and right heat sinks 50 is less than the surface area of the IC package 40, resulting in that the heat generated from the IC package 40 cannot be conducted sufficiently to the contact surfaces 51 of the heat sinks 50, and therefore cannot be dissipated into the open air. Consequently, there is a possibility that heat accumulates inside the IC package and the socket for electrical parts, causing damage to the IC package.

SUMMARY OF THE INVENTION

In order to solve the problems described above, an object of the present invention is to provide a socket for electrical parts, capable of improving the heat dissipation capability of a heat sink which dissipates the heat generated from an electrical part mounted on a mounting portion thereof when in contact with the electrical part, and also capable of preventing damage to the electrical part.

In order to achieve the object described above, a socket for electrical parts according to the present invention includes a socket body on which is formed a mounting portion for mounting an electrical part; contact pins disposed on the socket body and capable of connecting with connection terminals of the electrical part mounted on the mounting portion; and at least one heat sink including a contacting section to which the heat generated from the electrical part is conducted when in contact with the electrical part and a radiating section which transmits the heat conducted to the contacting section into the open air, wherein the thermal conductivity of the contacting section is higher than the thermal conductivity of the radiating section.

According to such a construction, since the heat generated from the electrical part is conducted quickly to the contacting section of the heat sink, the heat conducted to the contacting section can then be transmitted quickly into the open air from the radiating section of the heat sink, it is possible to rapidly dissipate the heat generated from the electrical part into the open air. Accordingly, it is possible to improve the heat dissipation capability of the heat sink which dissipates the heat generated from the electrical part mounted on the mounting portion, and also to prevent damage to the electrical part.

Furthermore, according to another aspect of the present invention, the socket for electrical parts includes a socket body on which is formed a mounting portion for mounting an electrical part; contact pins disposed on the socket body and capable of connecting with connection terminals of the electrical part mounted on the mounting portion; and at least one heat sink which transmits the heat generated from the electrical part into the open air when in contact with the electrical part. A flexible thermally conductive material layer connected with the heat sink conducts the heat generated from the electrical part to the contact surface.

According to this construction, the flexible thermally conductive material layer improves the heat dissipation capability of the heat sink which dissipates the heat generated from the electrical part mounted on the mounting portion, and also prevents damage to the electrical part.

DETAILED DESCRIPTION OF THE INVENTION

Figure 1:
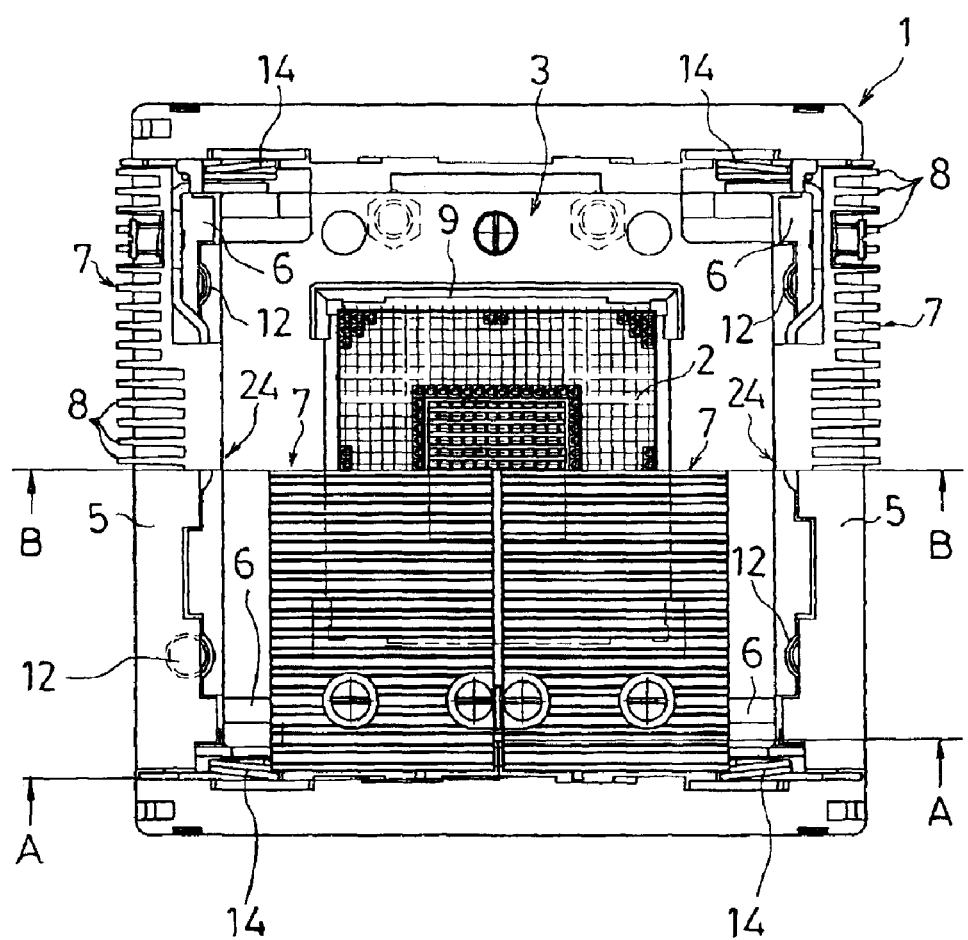
FIG. 1 is a plan view showing an embodiment of a socket for electrical parts according to the present invention, in which the upper half of the diagram shows a state where the heat sinks are opened and the lower half shows a state where the heat sinks are closed.
Figure 5:
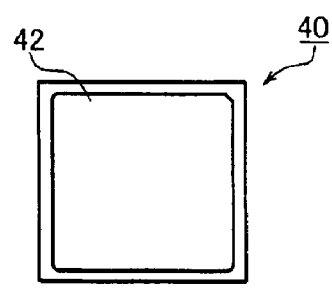
FIG. 5 is an explanatory diagram showing an appearance of an IC package to be mounted on a mounting portion of the socket for electrical parts.
Figure 5:
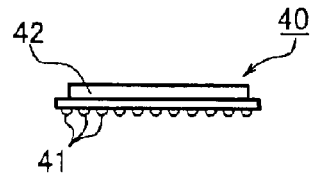

FIG. 1 is a plan view showing an embodiment of a socket 1 for electrical parts according to the present invention. The upper half of the diagram shows a withdrawal position in which heat sinks 7 are opened and an IC package can be inserted into or removed from a socket body 3, and the lower half shows a contact position in which the heat sinks 7 are closed for contact with the IC package which is mounted on a mounting portion 2 of the socket body 3. During performance testing of an electrical part, such as a BGA type IC package 40 (see FIG. 5) for example, the socket 1 which electrically connects this IC package 40 to an external circuit, while detachably holding this IC package 40 on the mounting portion 2, comprises the socket body 3, contact pins 4, an operating member 5, opening/closing members 6, and heat sinks 7.

Figure 4:
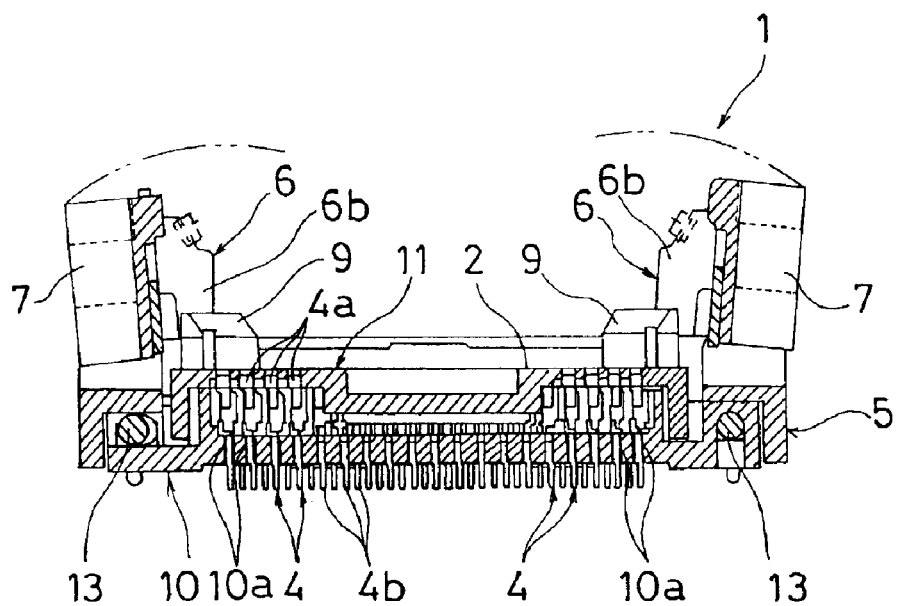
FIG. 4 is a sectional view of the socket for electrical parts along the line B—B in FIG. 1.

The socket body 3 serving as a base member of the socket 1 for electrical parts is molded in a box shape from a resin with high strength and excellent thermal resistance. As shown in FIG. 1, the mounting portion 2 mounting the IC package 40 thereon is formed on an upper surface of the socket body 3, and a guide section 9 positioning the IC package 40 during mounting is provided at a periphery of the mounting portion 2. Furthermore, as shown in FIG. 4, a plurality of press-fit holes 10a are formed in a bottom portion 10 of the socket body 3. The plurality of press-fit holes 10a are provided in positions to face connection terminals 41 (see (b) of FIG. 5) arranged on a lower surface of the IC package 40.

Furthermore, as shown in FIG. 4, the contact pins 4 are disposed so as to pass through the press-fit holes 10a. These contact pins 4 are to achieve an electrical connection between each of the connection terminals 41 of the IC package 40 mounted on the mounting portion 2 of the socket body 3 and the external circuit (not shown in the diagram), and are formed in a shape having a spring like property, by press working of a plate material with excellent electrical conductivity, for example. Specifically, top ends 4a of contact pin 4 can be opened/closed, and when closed, each retains the connection terminal 41 of the IC package 40. Furthermore, a slide plate 11 causing elastic deformation of the contact pins 4, thereby moving the top ends 4a, is disposed at a position corresponding to the top ends 4a of the contact pins 4.

Figure 2:
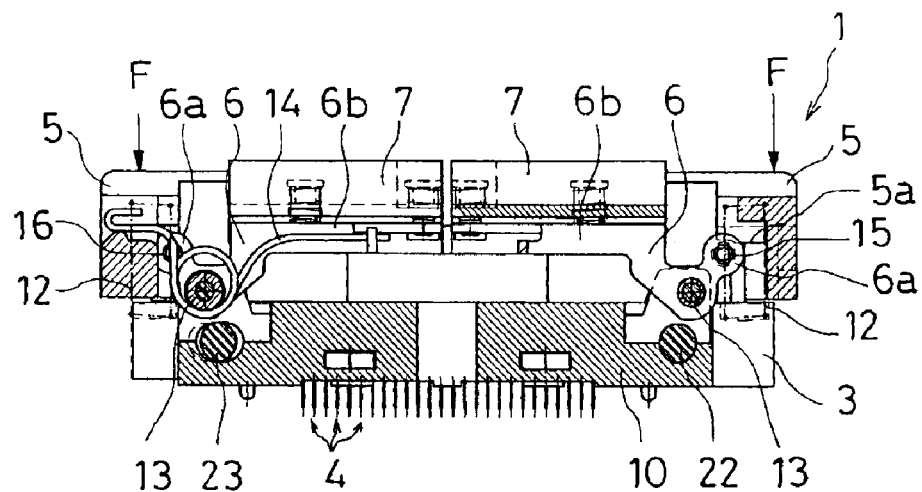
FIG. 2 is a sectional view of the socket for electrical parts along the line A—A in FIG. 1.
Figure 3:
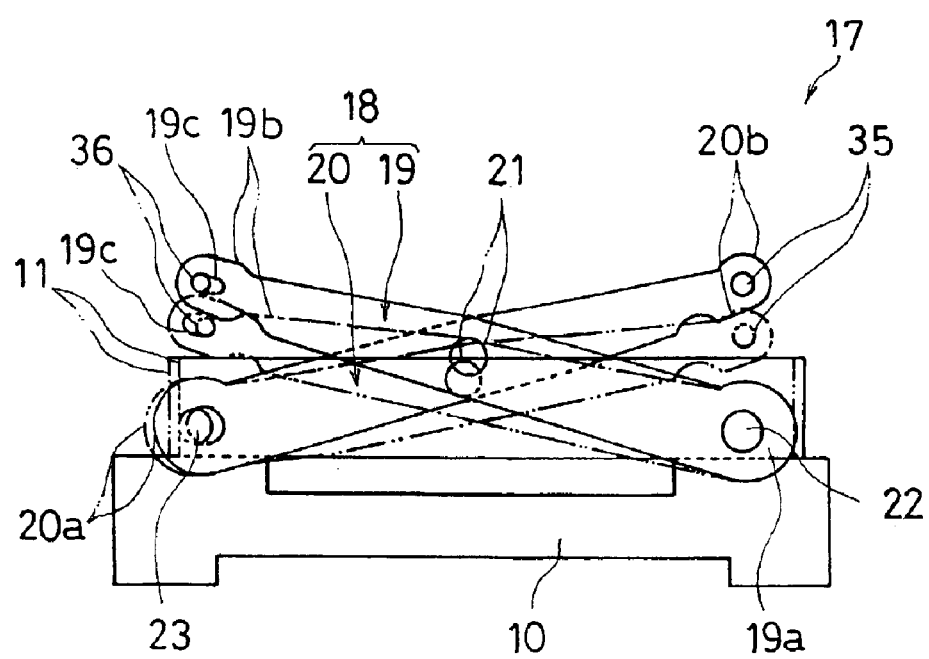
FIG. 3 is an explanatory diagram showing structures and operations of a linking mechanism and a slide plate constituting the socket for electrical parts.

Moreover, as shown in FIG. 1 and FIG. 2, the operating member 5 formed in a frame shape having an opening in its center is provided on top of the socket body 3, so as to enable it to move up and down relative to the socket body 3. The operating member 5 opening/closing the pair of left and right opening/closing members 6 described below, is forced upward by coil springs 12, for example, disposed at predetermined locations on the socket body 3. Furthermore, as shown in FIG. 2, if a force is applied to the operating member 5 in a direction of the arrows F, thereby pressing the operating member 5 downward, the heat sinks 7 are opened outward to the left and right, respectively, as shown in the upper half of FIG. 1. At this time, the slide plate 11 slides to the left as shown in FIG. 3, causing the top ends 4a of the contact pins 4 to open. Furthermore, when the force applied in the direction indicated by the arrows F in FIG. 2 is released, the heat sinks 7 are closed inward to cover the mounting portion 2 of the socket body 3 as shown in the lower half of FIG. 1. At this time, as shown in FIG. 3, the slide plate 11 slides to the right, and the top ends 4a of the contact pins 4 shown in FIG. 4 are closed to return to their original positions.

Further, as shown in FIG. 2, the pair of opening/closing members 6 are provided on both the left and right sides at an inner bottom portion of the socket body 3, and the heat sinks 7 are attached to these opening/closing members 6. This left and right pair of opening/closing members 6 is provided so as to be able to open and close through the operation of the operating member 5, and each opening/closing member 6 is capable of rotating about a shaft 13 and is forced to a closing direction by a helical spring 14 attached to the shaft 13. In addition, a pressure receiving section 15 is provided on a rear end 6a of the opening/closing member 6 on the right in FIG. 2 to receive a force from an inside bottom surface 5a of the operating member 5. Furthermore, a similar pressure receiving section 16 is provided on a rear end 6a of the opening/closing member 6 on the left in FIG. 2.

As a result, when the operating member 5 is pushed in the direction of the arrows F, the pressure receiving sections 15 and 16 provided on the rear ends 6a of the left and right pair of opening/closing members 6 receive the force from the inside bottom surface 5a of the operating member 5. As a result, the respective pressure receiving sections 15 and 16 serve as points of power, each of the shafts 13 serve as a fulcrum, and arm sections 6b of the left and right opening/closing members 6 serve as points of action, so that the heat sinks 7 attached to the opening/closing members 6 and the arm sections 6b thereof are opened outward to the left and right, as shown in FIG. 4.

As described above, the heat sinks 7 are attached to the arm sections 6b of the left and right opening/closing members 6. These heat sinks 7 serve as radiators which, in a state where the opening/closing members 6 are closed, contact the IC package 40 mounted on the mounting portion 2, and absorb (transmit) the heat generated from a heat generating location 42 of the IC package 40, to dissipate this heat into the open air. As shown in FIG. 1, a plurality of cooling fins 8 are provided on the heat sinks 7. These heat sinks 7 are molded using processes such as aluminum machining or an aluminum die-casting process, to achieve a low weight overall. As a result, it is possible to reduce a load on the IC package 40 when the heat sinks 7 are closed to apply a pressure to the IC package 40. Fittings for attaching the heat sinks 7 to the arm sections 6b of the opening/closing members 6 will be described later with reference to FIG. 12 to FIG. 14.

Furthermore, a linking mechanism 17 shown in FIG. 3 is connected to the operating member 5. This linking mechanism 17 is constructed such that the slide plate 11 is moved by up and down movement of left and right connecting pins 35 and 36 connected to the operating member 5, and comprises an X shaped link 18. This X shaped link 18 comprises a first linking member 19 and a second linking member 20, both being approximately the same length, and these lining members are rotatably connected together about a center connecting pin 21. A lower end 19a of the first linking member 19 is rotatably connected to a bottom portion 10 of the socket body 3 by a lower end connecting pin 22, and a lower end 20a of the second linking member 20 is rotatably connected to one end of a side face in the sliding direction of the slide plate 11 by a lower end connecting pin 23. Furthermore, an elongated hole 19c is formed on an upper end 19b of the first linking member 19, and an upper end connecting pin 36 passes through this elongated hole 19c to rotatably connect the upper end 19b to the operating member 5, and an upper end 20b of the second linking member 20 is rotatably connected to the operating member 5 by another upper end connecting pin 35.

Consequently, as shown in FIG. 2, when a force in the direction indicated by the arrows F is applied to the operating member 5 to push the operating members 5 downward, the X shaped link 18 shown in FIG. 3 moves from a position indicated by the solid line to a position indicated by the broken line, causing the slide plate 11 to move to the left. This movement of the slide plate 11 results in the opening of the top ends 4a of the contact pins 4 shown in FIG. 4. Furthermore, when the force in the direction indicated by the arrows F that has been applied to the operating members 5 is released, the top ends 4a of the contact pins 4 return to their original positions and are closed.

Accordingly, as shown in FIG. 4, by first mounting the IC package 40 (see FIG. 5) on the mounting portion 2 of the socket body 3 in the state where the left and right heat sinks 7 are opened, and then closing these heat sinks 7, it is possible to press down the IC package 40 mounted on the mounting portion 2 by the heat sinks 7 to be secured, and furthermore, it is possible to retain the respective connection terminals 41 of the IC package 40 by the top ends 4a of the contact pins 4 to be connected to the external circuit.

As described above, the heat sinks 7 are attached to the opening/closing members 6 provided on the socket body 3 so as to enable them to be opened/closed, and are capable to move between a contact position where they contact the IC package 40, and a withdrawal position where the heat sinks 7 are separated from the IC package 40 so that the IC package 40 can be removed from the socket body 3. Consequently, by opening/closing the heat sinks 7, the IC package 40 can be installed in the socket body 3 interchangeably.

Furthermore, when the operating member 5 provided so as to be movable up and down relative to the socket body 3 is at its highest position, the heat sinks 7 are in the contact position, and when the operating member 5 is at its lowest position, the heat sinks 7 are in the withdrawal position. As a result, by simply moving the operating member 5 up and down, it is possible to open/close the heat sinks 7, and to easily install the IC package 40 to the socket body 3 interchangeably.

Figure 6:
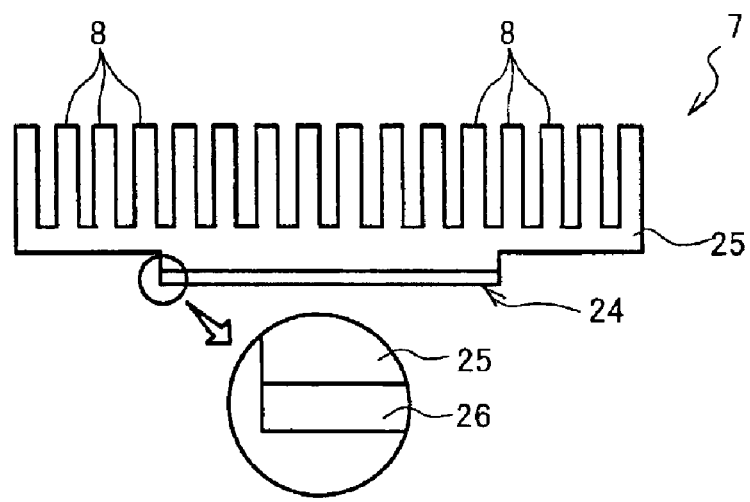
FIG. 6 is a side view showing a two-layered construction in a contact surface of the heat sink.

In the present invention, the heat sinks 7 of the socket 1 for electrical parts have a two-layered construction comprising a contacting section 26 having a contact surface (hereafter referred to as a "pedestal surface") 24 to be in contact with the IC package 40, and a radiator (radiating section) 25 which transmits the heat conducted by the contacting section 26 into the open air as shown in FIG. 6. Here, as described above, the radiating section 25 is formed from a lightweight material such as aluminum. On the other hand, the contacting section 26 is formed from a material, such as copper, with the thermal conductivity higher than that of the aluminum radiating section 25. For example, the thermal conductivity of copper at 100° C. is approximately 395 W/mK, which is higher than the thermal conductivity of aluminum at the same temperature (approximately 210 W/mK).

As a result, the heat generated from a heat generating section 42 of the IC package 40 during performance testing of the IC package 40 can be conducted sufficiently to the pedestal surfaces 24 and then conducted efficiently via the contacting sections 26 to the radiating sections 25 of the heat sinks 7. The heat conducted by the pedestal surfaces 24 of the heat sinks 7 can then be conducted effectively to the cooling fins 8 formed on each of the radiating sections 25 of the heat sinks 7 to be dissipated into the open air. Accordingly, it is possible to improve the heat dissipation capability of the heat sinks 7, and to prevent damage to the IC package 40 during performance testing.

By forming each of the heat sinks 7 in a two-layered construction comprising the radiating section 25 formed from a lightweight material and the contacting section 26 formed from a material with the thermal conductivity higher than that of the radiating section 25, it becomes possible to conduct the heat directly from the contacting section 26 to the radiating section 25, resulting in excellent heat dissipation. Accordingly, the heat can be conducted efficiently to the cooling fins 8 of each heat sink 7 and then dissipated, thereby improving the heat dissipation capability of each heat sink 7.

Figure 7:
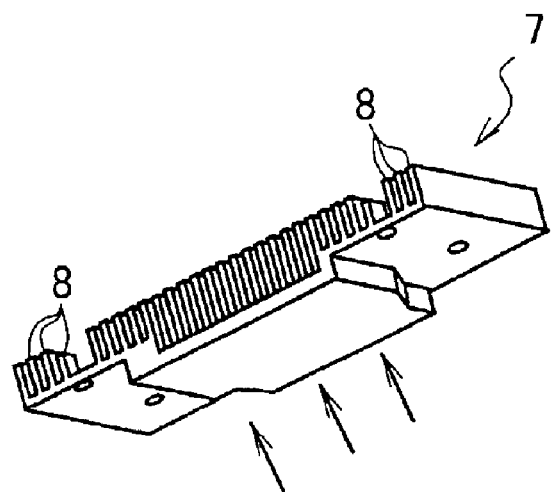
FIG. 7 is an explanatory diagram showing a state where a material layer with the high thermal conductivity is formed on the contact surface of the heat sink shown in FIG. 6.

Here, the contacting section 26 of each heat sink 7 is formed by performing thermal spraying of a material with the thermal conductivity higher than that of the radiating section 25 onto the radiating section 25. Specifically, in the radiating section 25, only a site corresponding to the contacting section 26 is exposed, while masking a site not corresponding to the contacting section 26 using a predetermined jig (not shown). The copper is then melted by either a flame of an inflammable gas generated from a combination of oxygen gas and acetylene or by electric energy using an arc, and as shown in FIG. 7, and small particles of the melted copper are sprayed at a high speed onto the site corresponding to the contacting section 26, thereby depositing the copper on the surface of the radiating section 25. As a result, a sprayed coating with high thermal conductivity can be formed on a predetermined surface of the heat sink 7. Then, a surface to be in contact with the IC package 40 is polished smooth to form the pedestal surface. This sprayed coating with the high thermal conductivity serves as the contacting section 26 shown in FIG. 6. Further, in actual using, nickel plating is applied to the entire surface of the heat sink 7 including the pedestal surface 24, so as to improve the rust resistance and heat resistance of the heat sink 7.

Furthermore, although there are generally some holes in the sprayed coating serving as the contacting section 26, it is possible to reduce the size of the holes by reducing the size of the copper particles to be used in the spraying process, thereby enabling the sprayed coating to be formed with the high density closer to its bulk density. As a result, the number of gaps at a boundary surface between the radiating section 25 and the high thermal conductivity contacting section 26 can be significantly minimized. Accordingly, heat loss (contact thermal resistance) at the boundary surface of the radiating section 25 and the high thermal conductivity contacting section 26 can be minimized. Note that the material used to form the contacting section 26 that is the layer of material with the high thermal conductivity is not limited to copper, and any material may be used provided that it offers the thermal conductivity higher than that of the radiating section 25.

Figure 8:
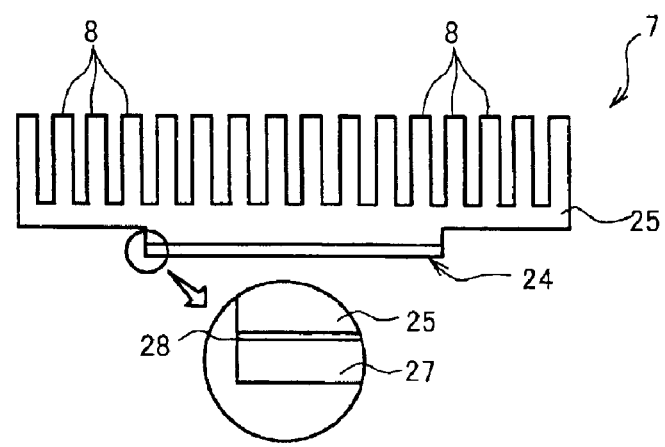
FIG. 8 is a side view showing a three-layer construction in the contact surface of the heat sink.

FIG. 8 is a side view showing a second embodiment of the present invention. The heat sinks 7 according to this embodiment have a three-layered construction obtained by joining together the radiating section 25 formed from a lightweight material such as aluminum, and a thermal conduction member 27 that serves as the contacting section and is formed by processing a material layer with the thermal conductivity higher than that of the radiating section 25, such as a sheet of copper, via a joining material layer 28 serving as a joining section. Consequently, during performance testing of the IC package 40, the heat generated from heat generating location 42 of the IC package 40 is conducted sufficiently to the pedestal surface 24, and then can be conducted efficiently to the radiating section 25 via both the thermal conduction member 27, which is the material layer with the high thermal conductivity joined to the radiating section 25, and the joining material layer 28. The heat conducted to the radiating section 25 is then transmitted into the open air from the cooling fins 8 of each heat sink 7 to be dissipated, thereby improving the heat dissipation capability of each heat sink 7.

Figure 9:
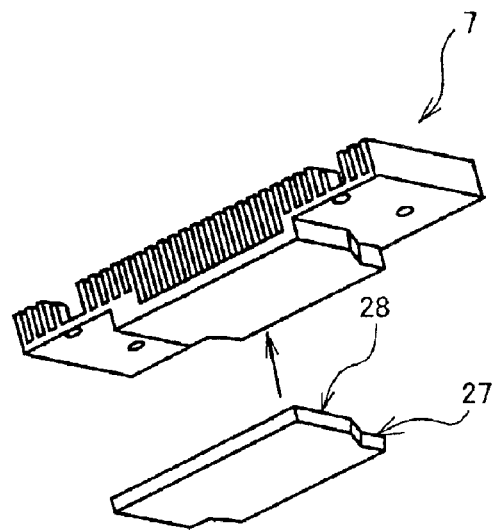
FIG. 9 is an explanatory diagram showing a state where a material layer with the high thermal conductivity is joined to the contact surface of the heat sink shown in FIG. 8.

Here, the joining material layer 28 is made of a material, for example tin, with a melting point lower than those of the radiating section 25 and the thermal conduction member 27. Specifically, a polishing process and a cleaning process are performed on a copper sheet with the thermal conductivity higher than that of the radiating section 25 made of aluminum, to smooth a surface of the copper sheet and remove contaminants, such as grease or rust, adhered to the surface. The copper sheet subjected to cleaning process is then die cut by a press to form the thermal conduction member 27 as shown in FIG. 9. After masking only a surface to serve as the pedestal surface, the thermal conduction member 27 is placed in a solution in which tin is dissolved as a cathode, and an anode is placed in the solution so as to face the thermal conduction member 27, to flow a direct current through the solution. As a result, tin is deposited on the surface of the thermal conduction member 27 excluding the masked surface, thereby achieving tin plating. The tin plating applied to the surface of the thermal conduction member 27 serves as the joining material layer 28 which joins the radiating section 25 and the thermal conduction member 27.

As shown in FIG. 9, the thermal conduction member 27 on which the tin plating serving as the joining material layer 28 has been applied and a predetermined site of the radiating section 25 are aligned with each other to be brought into close contact, and heated in a furnace to approximately 250 to 300° C. to melt only the tin joining material layer 28. Subsequently, this heat sink 7 of three-layered construction is gradually cooled. As a result, it is possible to join the radiating section 25 and the thermal conduction member 27 tightly together via the joining material layer 28. At this time, since the thermal conduction member 27 is made of sheet copper, the heat generated from the heat generating location 42 of the IC package 40 during performance testing can be transmitted sufficiently.

In the description above, there has been described the case where the joining material layer 28 is made of tin, but the present invention is not limited thereto, and any material may be used which has a melting point lower than those of the radiating section 25 and the thermal conduction member 27. Furthermore, the three-layered heat sink 7 has been obtained by applying the plating serving as the joining material layer 28 to the thermal conduction member 27. However, the present invention is not limited thereto, and it is also possible that the plating serving as the joining material layer 28 is applied to the radiating section 25, and then the thermal conduction member 27 is brought into close contact with the joining material layer 28, to be heated.

Figure 10:
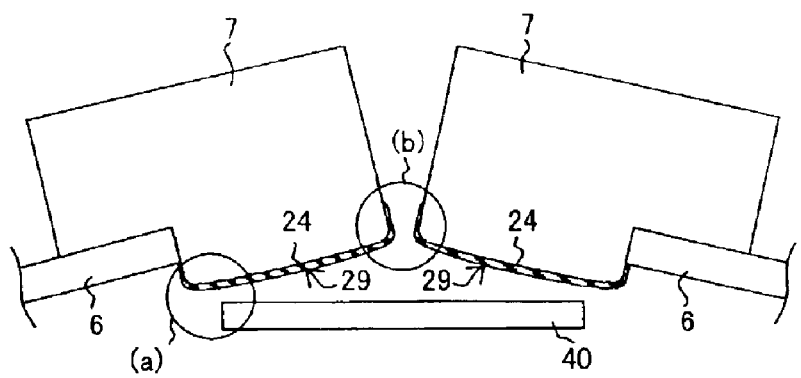
FIG. 10 is an explanatory diagram showing an embodiment in which a thermally conductive sheet is disposed on the contact surfaces of the heat sinks.

FIG. 10 is a side view showing a third embodiment of the present invention. In this embodiment, heat conduction sheets 29 are disposed on both of the pedestal surfaces 24 each of which applies a pressure to the IC package 40 when the heat sinks 7 are in contact with the IC package 40. These heat conduction sheets 29, each of which is formed from a flexible heat conduction material, and contacts an upper surface of the IC package 40 when the heat sinks 7 are closed to conduct heat generated from the IC package 40 to the pedestal surfaces 24 of the heat sinks 7, closely contact the surface of the IC package 40 without leaving gaps, due to its flexibility. Consequently, gaps formed by the irregularities (swelling and surface roughness and the like) in the surfaces of the heat sinks 7 and the surface of the IC package 40 can be prevented from occurring at a joint surface when the pedestal surface 24 is in direct contact with the upper surface of the IC package 40. Accordingly, it is possible to reduce the contact thermal resistance between the IC package 40 and the pedestal surface 24, thereby improving the thermal conductivity from the IC package 40 to the heat sinks 7.

Furthermore, since an impact on the IC package 40 can be absorbed due to the flexibility of the heat conduction sheet 29, as shown in FIG. 10, when the left and right heat sinks 7 are closed, damage to edge portions (see (a) of FIG. 10) of the IC package 40 by the pedestal surfaces 24 of the heat sinks 7 can be prevented.

Each heat conduction sheet 29 is made of the flexible material which conducts heat generated from the IC package 40 to the pedestal surfaces 24 of the heat sinks 7. Specifically, the heat conduction sheets 29 can be formed by processing fine granules of graphite into a sheet form, or formed from silicone rubber. The heat generated from the IC package 40 can thereby be conducted to the pedestal surfaces 24 of the heat sinks 7. Accordingly, it is possible to ensure heat thermal conductivity of the heat conduction sheets 29, and to conduct sufficiently the heat generated from the IC package 40 to the pedestal surfaces 24, thereby improving the heat dissipation capability of the heat sinks 7.

Figure 11:
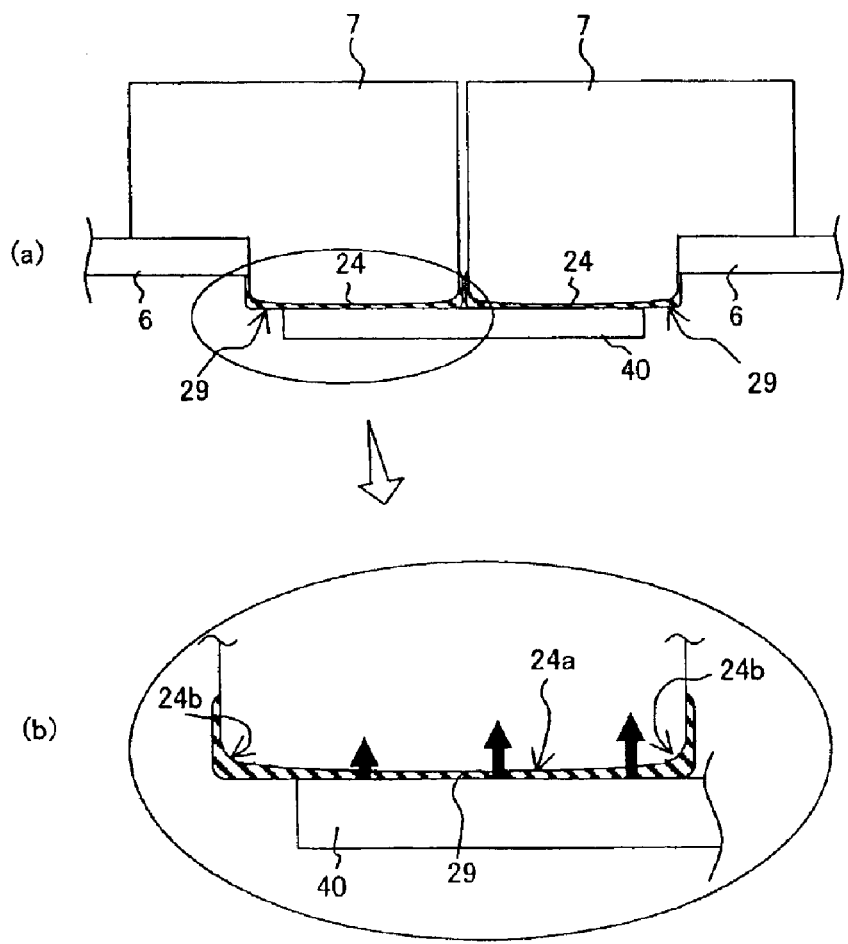
FIG. 11 is an explanatory diagram showing a state where the heat sinks shown in FIG. 10 are closed and the contact surfaces thereof are in close contact with the IC package.

Furthermore, as shown in (a) of FIG. 11, each of the pedestal surfaces 24 of the heat sinks 7 is formed so as to project further outward than an outer periphery of the IC package 40 mounted on the mounting portion 2. As a result, the combined surface area of the pedestal surfaces 24 of both heat sinks 7 is greater than the surface area of the IC package 40, and as such the entire upper surface of the IC package 40 can be covered by the pedestal surfaces 24 of the heat sinks 7. Accordingly, it is possible to conduct the heat generated from the IC package 40 to the pedestal surfaces 24 of the heat sinks 7 via the heat conduction sheets 29, thereby improving the heat dissipation capability of the heat sinks 7.

Moreover, as shown in (b) of FIG. 11, for example, in each of the pedestal surfaces 24 of the heat sinks 7, as a protruding section 24a, a site to face the center region of the IC package 40 mounted on the mounting portion 2 is made to protrude further than a periphery thereof. As a result, when the heat sinks 7 are closed, each heat conduction sheet 29 is deformed by the protruding section 24a at a portion thereof positioned under the protruding section 24a, so that a large amount of contact pressure can be applied to the IC package 40. Furthermore, since at this time a portion of each heat conduction sheet 29 underneath the periphery of the protruding section 24a is also deformed slightly, the contact thermal resistance between the entire pedestal surfaces 24 and the IC package 40 is reduced. Accordingly, the heat generated from the IC package 40 can be conducted sufficiently to the pedestal surfaces 24 of the heat sinks 7.

Peripheral sections 24b of the pedestal surfaces 24 of the heat sinks 7 are chamfered with rounded corners as shown in (b) of FIG. 11. As a result, as shown in FIG. 10, it is possible to prevent damage to the edge portions (see (a) of FIG. 10) of the IC package 40 when the left and right heat sinks 7 are closed to apply a pressure to the IC package 40. Furthermore, it is possible to prevent inside bottom portions of the peripheral sections 24b (see (b) of FIG. 10) of the pedestal surfaces 24 of the heat sinks 7 from breaking. Accordingly, the reliability of the performance testing of the IC package 40 can be improved.

In the description above, there has been described the case where the present invention is applied to a so-called open top type socket for electrical parts in which the operating members 5 are provided on the socket body 3 in a vertically movable manner. However, the present invention is not limited thereto, and may be applied to a so-called clam shell type socket in which a cover member which presses to secure the socket for electrical parts is provided at one end of the socket body rotatably.

Furthermore, there has been described the case where the present invention is applied to a socket for electrical parts in which the heat sinks 7 are capable of movement between the contact position where the heat sinks 7 are closed to be in contact with the electrical parts and the withdrawal position where the heat sinks 7 are separated so that the electrical parts can be inserted into or removed from the socket body 3. However, the present invention is not limited thereto, and may be applied to a socket for electrical parts in which the heat sink is formed independently of the socket body as a separate member, and is provided on the socket body in a removable manner.

Moreover, the present invention is not limited to a socket for electrical parts for use in the performance testing or burn-in testing of electrical parts, but can be widely applied to a socket for electrical parts for mutually connecting electrical parts with circuits, such as a socket for electrical parts for a CPU mounted on a motherboard of a computer or the like.

Figure 12:
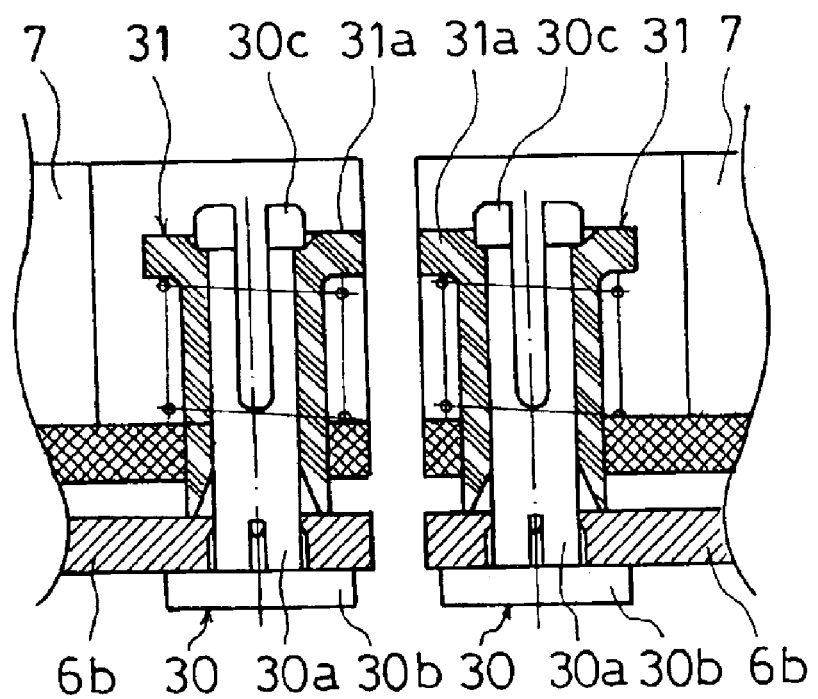
FIG. 12 is a sectional view showing a first example of a fitting used to attach the heat sinks to opening/closing members.

FIG. 12 is a sectional view showing a first example of a fining for attaching the heat sinks 7 to the arm sections 6b of the opening/closing members 6, illustrating a first guide pin 30 and a tube 31. The first guide pin 30 is engaged within the tube 31 described below, to be connected together, and comprises a substantially cylindrical body section 30a molded from plastic or stainless steel, which has an outside diameter approximately equivalent to an inside diameter of the tube 31 and is provided with a collar section 30b in a rivet head shape at a lower end thereof. The body section 30a has a spring-like property at the other end side thereof, and detent sections 30c are provided on the tip of the other end. Furthermore, the tube 31 is to be engaged with the first guide pin 30 to be connected together, and a catching section 31a is provided on the tube 31 at a position corresponding to the detent sections 30c of the first guide pin 30.

Figure 13:
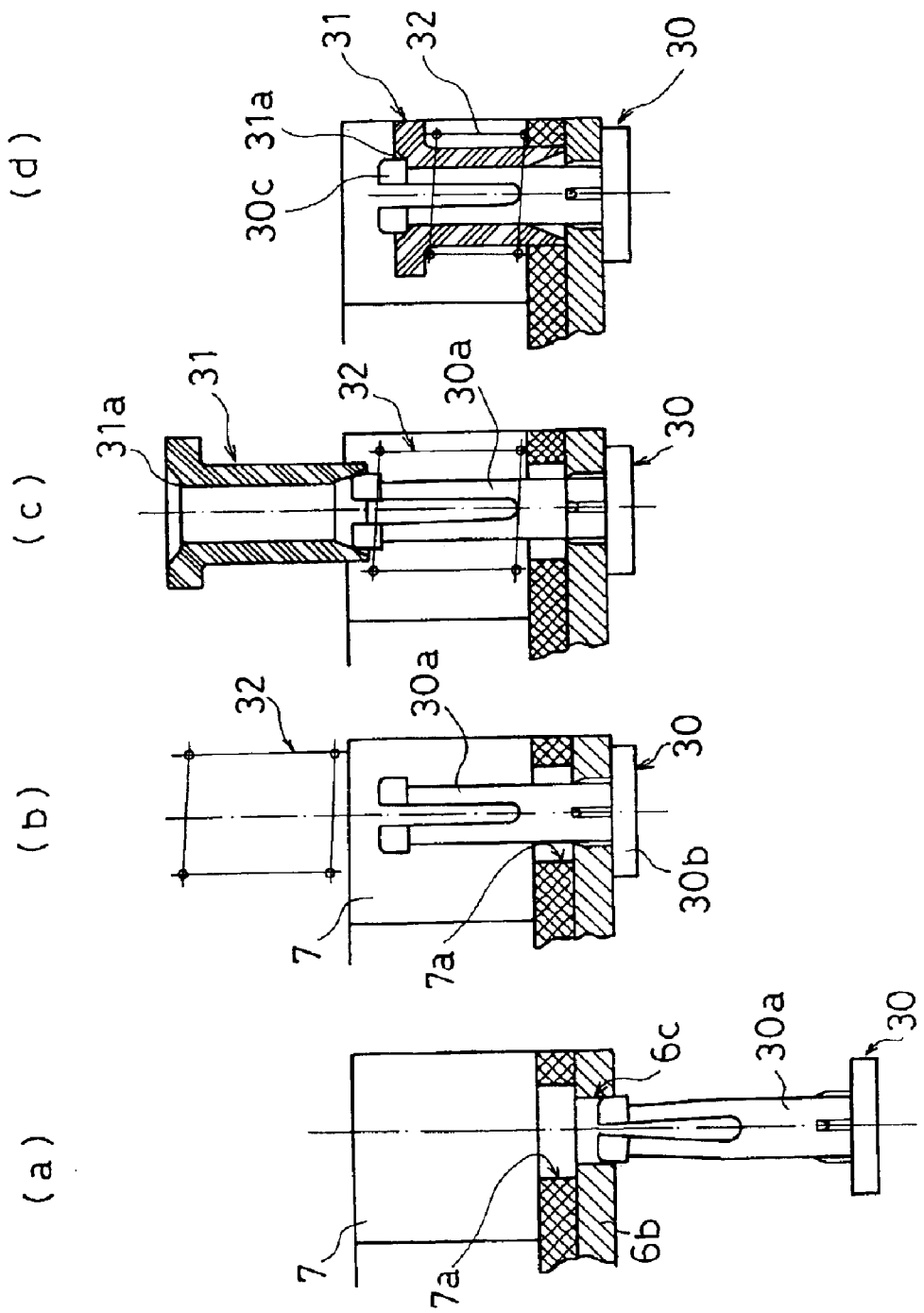
FIG. 13 is a series of sectional views showing a process for attaching the heat sink to the opening/closing member using the fitting shown in FIG. 12.

Next, with reference to FIG. 13, there will be described the process of attaching the heat sinks 7 to the arm sections 6b of the opening/closing members 6 using the first guide pin 30 and the tube 31 configured in the above manner. First, as shown in (a) of FIG. 13, an attachment hole 6c formed in the arm section 6b and a circular hole 7a formed in the heat sink 7 are aligned with each other, and the body section 30a of the first guide pin 30 is inserted from underneath into the attachment hole 6c of the arm section 6b. Next, as shown in (b) of FIG. 13, a coil spring 32 is attached to the body section 30a of the first guide pin 30, which is protruding upward from the circular hole 7a in the heat sink 7. Then, as shown in (c) of FIG. 13, the tube 31 is passed over the body section 30a of the first guide pin 30, to which the coil spring 32 is attached. The first guide pin 30 and the tube 31 are then engaged with each other to be connected together as shown in (d) of FIG. 13. The heat sink 7 is thereby attached to the opening/closing member 6. At this time, the detent sections 30c of the first guide pin 30 are caught by the catching section 31a of the tube 31, preventing the tube 31 from being removed from the first guide pin 30.

In order to detach the heat sink 7 from the opening/closing members 6, first the detent sections 30c of the first guide pin 30 are pinched to be closed, thereby releasing the detent sections 30c from the catching section 31a of the tube 31, and the tube 31 is then removed from the first guide pin 30 by an urging force of the coil spring 32.

As described above, by using the first guide pin 30 and the tube 31 as the fitting for attaching the heat sinks 7 to the arm sections 6b of the opening/closing members 6, for example, special purpose metal screws (not shown) are not required. Thus, it is possible to facilitate the operations of attaching or replacing the heat sinks 7, and also to greatly reduce the costs of parts and assembly.

Figure 14:
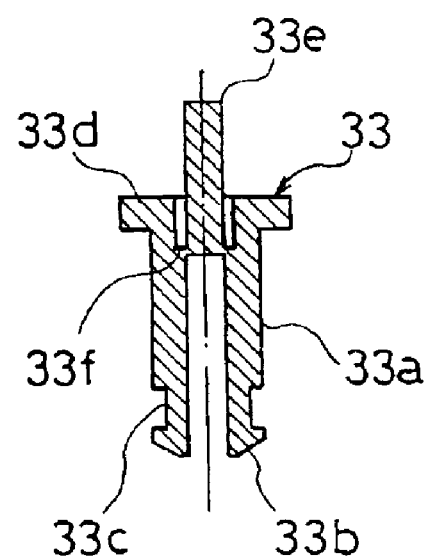
FIG. 14 is a sectional view showing a second example of the fitting used to attach the heat sinks to the opening/closing members.
Figure 14:
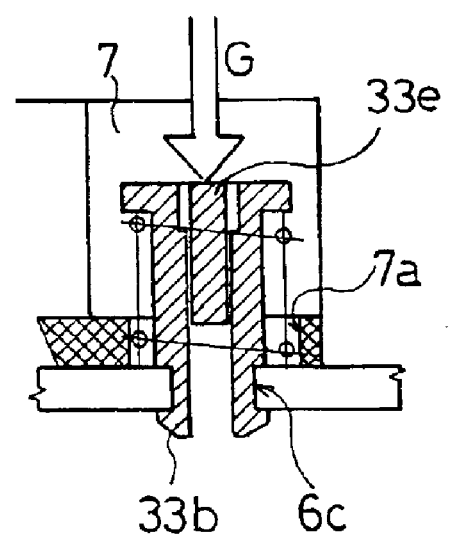
Figure 15:
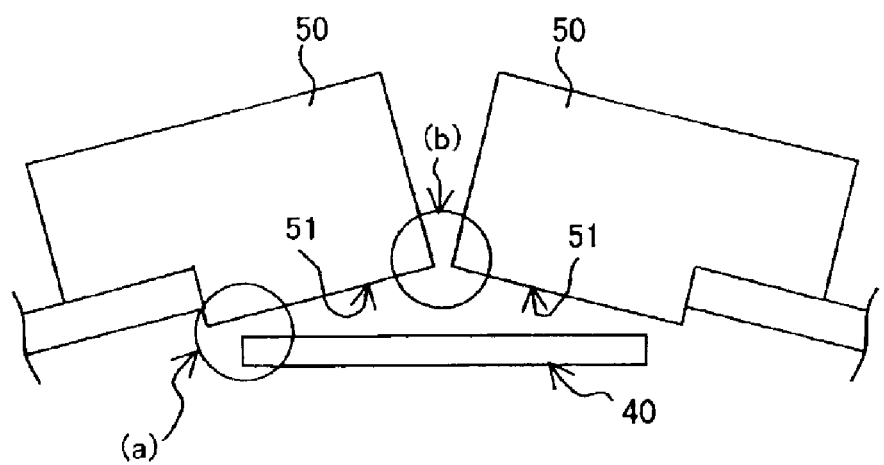
FIG. 15 is an explanatory diagram showing a state where the contact surfaces of the heat sinks in a conventional socket for electrical parts are larger than the IC package.
Figure 16:
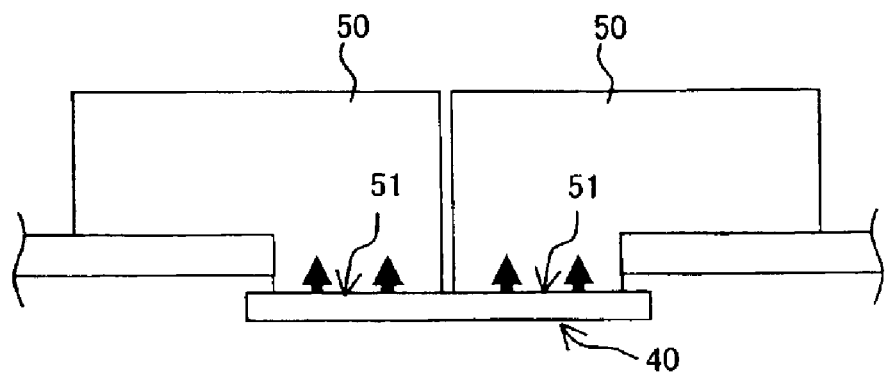
FIG. 16 is an explanatory diagram showing a state where the heat sinks of a conventional socket for electrical parts are in contact with the IC package.

FIG. 14 is a sectional view showing a second example of a fitting used to attach the heat sinks 7 to the arm sections 6b of the opening/closing members 6, and illustrates a second guide pin 33. This second guide pin 33 is a member to be used to attach the heat sinks 7 to the opening/closing members 6 without requiring the use of any additional members, and is formed from plastic, for example. This second guide pin 33 includes a cylindrical body section 33a wider than the attachment hole 6c in the arm section 6b of the opening/closing member 6, and has a spring-like property at a tip section 33b side thereof, and a groove 33c having approximately the same width as the arm section 6b of the opening/closing member 6 is provided on the tip section 33b. Furthermore, an insertion pin 33e is provided behind a collar section 33d at a base end side of the second guide pin 33. This insertion pin 33e is connected to an upper edge of an inside circumferential surface of the body section 33a via a connection piece 33f. If a predetermined force G shown in (b) of FIG. 14 is applied to the insertion pin 33e, then the connection piece 33f breaks, and the insertion pin 33e is forced to be engaged with the inside of the approximately cylindrical body section 33a.

Next, there will be described the process of attaching the heat sinks 7 to the arm sections 6b of the opening/closing members 6 using the second guide pin 33 configured in the above manner. First, the attachment hole 6c in the arm section 6b and the circular hole 7a in the heat sink 7 are aligned with each other, and after attaching the coil spring 32 to the body section 33a of the second guide pin 33, the second guide pin 33 is inserted from above into the circular hole 7. At this point, the tip section 33b of the second guide pin 33 bends to be fitted into the attachment hole 6c of the arm section 6b. At this time, the second guide pin 33 is secured within the attachment hole 6c by the groove 33c provided on the tip section 33b. If the predetermined force G is then applied to the insertion pin 33e, the connection piece 33f breaks, and the insertion pin 33e is forced to be engaged with the inside of the body section 33a, as shown in (b) of FIG. 14.

As a result, since the body section 33a becomes difficult to bend, the heat sinks 7 can be attached to the opening/closing members 6 without the tip section 33b of the guide pin 33 opening out. Accordingly, the heat sinks 7 can be attached to the opening/closing members 6 without the necessity of using additional members such as spring washers or a screw locking agent or the like. Furthermore, since a screwdriver is not required for assembly, it is possible to greatly simplify the assembly process, and also to greatly reduce the costs of parts and assembly.

What is claimed is:

1. A socket for an electrical part comprising:
    a socket body on which is formed a mounting portion for mounting an electrical part;
    contact pins disposed on said socket body and capable of connecting with connection terminals of said electrical part mounted on said mounting portion;
    at least one opening/closing member provided on said socket body so as to enable it to be opened and closed; and
    at least one heat sink attached to said at least one opening/closing member capable of moving between a contact position in which said heat sink contacts said electrical part and a withdrawal position in which said heat sink separates from said electrical part so that said electrical part can be inserted into or removed from said socket body;
    wherein said heat sink includes a contacting section which contacts with said electrical part and receives the heat generated from said electrical part when said heat sink is in the contact position, and a radiating section integral with said contacting section and which transmits the heat conducted to said contacting section into the open air, and
    wherein the thermal conductivity of said contacting section is higher than the thermal conductivity of said radiating section.

2. A socket for an electrical part according to claim 1, wherein said heat sink has a two-layered construction with said radiating section formed from a lightweight material and said contacting section formed from a material with a thermal conductivity higher than that of said radiating section.

3. A socket for an electrical part according to claim 2, wherein said contacting section is formed by performing thermal spraying of a material with the thermal conductivity higher than that of said radiating section onto said radiating section.

4. A socket for an electrical part according to claim 1, wherein said heat sink has a three-layered construction obtained by joining together said radiating section formed from a lightweight material, and said contacting section formed from a material with the thermal conductivity higher than that of said radiating section, via a joining section formed from a material other than the materials of said radiating section and said contacting section.

5. A socket for an electrical part according to claim 1, further comprising:
    an operating member provided on top of said socket body, so as to enable to move up and down relative to said socket body,
    wherein, when said operating member is at its highest position, said heat sink is in the contact position, and when said operating member is at its lowest position, said heat sink is in the withdrawal position.

6. A socket for an electrical part, comprising:
    a socket body on which is formed a mounting portion for mounting an electrical part;
    contact pins disposed on said socket body and capable of connecting with connection terminals of said electrical part mounted on said mounting portion; and
    at least one heat sink capable of moving between a contact position in which said heat sink contacts said electrical part and a withdrawal position in which said heat sink separates from said electrical part so that said electrical part can be inserted into or removed from said socket body;
    wherein said heat sink includes a contacting section which contacts with said electrical part and receives the heat generated from said electrical part when said heat sink is in the contact position, and a radiating section integral with said contacting section and which transmits the heat conducted to said contacting section into the open air, wherein the thermal conductivity of said contacting section is higher than the thermal conductivity of said radiating section, wherein said heat sink has a three-layered construction obtained by joining together said radiating section formed from a lightweight material, and said contacting section formed from a material with the thermal conductivity higher than that of said radiating section, via a joining section formed from a material other than the materials of said radiating section and said contacting section, and wherein said joining section is made of a material with a melting point lower than those of the material forming said radiating section and the material forming said contacting section.

7. A socket for an electrical part comprising:

a socket body on which is formed a mounting portion for mounting an electrical part;

contact pins disposed on said socket body and capable of connecting with connection terminals of said electrical part mounted on said mounting portion; and at least one heat sink rotatably connected with said socket body for movement between a contact position wherein said heat sink contacts and applies pressure to said electrical part and a withdrawal position wherein said heat sink separates from said electrical part so that said electrical part can be inserted into or removed from said socket body, wherein said heat sink transmits the heat generated from said electrical part into the open air when it is in the contact position, wherein on a contact surface of said heat sink to which said electrical part contacts, there is disposed, a flexible thermally conductive material which conducts the heat generated from said electrical part to said contact surface, and wherein said contact surface and said thermally conductive material are formed so as to project beyond outside edges of said electrical part mounted on said mounting portion.

8. A socket for an electrical part according to claim 7, wherein said contact surface of said heat sink is formed so that a site to face the center region of said electrical part mounted on said mounting portion is made to protrude further than a periphery thereof.

9. A socket for an electrical part according to claim 7, wherein said contact surface of said heat sink is chamfered with rounded corners.

* * * * *